US005656147A

United States Patent [19]
Ishimoto et al.

[11] Patent Number: 5,656,147
[45] Date of Patent: Aug. 12, 1997

[54] METHOD FOR FABRICATING A SWITCHING DEVICE BY ANODIZATION

[75] Inventors: Yoshihisa Ishimoto, Sakai; Masahiro Kishida, Nabari; Toshiyuki Yoshimizu, Soraku-gun, all of Japan

[73] Assignee: Sharp Kabushiki Kaisha, Osaka, Japan

[21] Appl. No.: 499,176

[22] Filed: Jul. 7, 1995

[30] Foreign Application Priority Data

Jul. 12, 1994 [JP] Japan .................................. 6-160136

[51] Int. Cl.$^6$ .......................... C25D 11/02; H01L 21/316
[52] U.S. Cl. ............................ 205/96; 205/106; 205/122; 205/124
[58] Field of Search ........................... 205/118, 121, 205/122, 124, 128, 96, 106

[56] References Cited

U.S. PATENT DOCUMENTS

| | | | |
|---|---|---|---|
| 3,640,854 | 2/1972 | Klein | 205/128 |
| 4,203,087 | 5/1980 | Kovac et al. | 338/35 |
| 4,469,568 | 9/1984 | Kato et al. | 205/162 |
| 5,352,907 | 10/1994 | Matsuda et al. | 257/59 |

FOREIGN PATENT DOCUMENTS

| | | |
|---|---|---|
| 4-6927 | 2/1992 | Japan . |
| 6-3701 | 1/1994 | Japan . |
| 2107115 | 4/1983 | United Kingdom . |

Primary Examiner—Kathryn L. Gorgos
Assistant Examiner—William T. Leader
Attorney, Agent, or Firm—Nixon & Vanderhye P.C.

[57] ABSTRACT

When an anodized film is to be formed, one formation-voltage input point is used. An interconnecting ring for anodization is provided between the input point and a pattern to be anodized. The interconnecting ring is in contact with and encloses the pattern. Another interconnecting ring to which the formation-voltage input point is connected is provided around the interconnecting ring. In addition, two junction points are provided at vertically symmetric positions with respect to the pattern. The junction points are connected to the interconnecting ring. The junction points are connected to upper connection terminals and lower connection terminals of the pattern by respective thin-line groups including a plurality of thin lines. The formation voltages at respective input points at the upper connection terminals and the lower connection terminals of the pattern are made equal to each other.

8 Claims, 13 Drawing Sheets

METHOD FOR FABRICATING A SWITCHING DEVICE BY ANODIZATION

BACKGROUND OF THE INVENTION

1. Field of the Invention

The present invention relates to an anodizing interconnection and to a method for fabricating a switching device using an anodization method which is used, for example, in a production process of a liquid crystal display apparatus.

2. Description of the Related Art

Active matrix type liquid crystal display apparatuses include a liquid crystal display apparatus provided with a three-terminal nonlinear device which is typified by a thin film transistor (TFT) as a switching device. Such a liquid crystal display apparatus conventionally necessitates six or more steps for depositing thin films and performing photolithography during the production process. As a result, the production process is complicated, so that the most significant challenges are to shorten the production time and to reduce the cost. Another liquid crystal display apparatus is provided with a two-terminal nonlinear device which is set into a conductive state at a predetermined voltage or more as a switching device. Such a liquid crystal display apparatus having the two-terminal nonlinear device is superior in production time and cost, and consequently has been explosively and intensively developed.

A known typical two-terminal nonlinear device is a MIM (Metal-Insulator-Metal) device. In a liquid crystal display apparatus using the MIM device as a switching device, a liquid crystal layer is provided between an active matrix substrate on which pixel electrodes and MIM devices are formed, and a counter substrate on which counter electrodes are formed. In the liquid crystal display apparatus, a voltage applied to the liquid crystal layer is abruptly changed between an on state and an off state, so that a high-contrast display can be performed even in a high duty driving which is required in response to tendencies to increase the screen size of the display apparatus and to increase the resolution.

FIGS. 11 and 12 show a construction of a one-pixel portion of a conventional active matrix substrate provided with a MIM device as a switching device. FIG. 11 is a plan view thereof and FIG. 12 is a cross-sectional view taken along a line A–A' in FIG. 11. In FIGS. 11 and 12, on a substrate 1 a signal line 2 made of tantalum and a lower electrode 3 which is branched from the signal line 2 are provided. An insulating film 4 made of tantalum pentoxide is provided so as to cover the lower electrode 3. On the insulating film 4 and the substrate 1, an upper electrode 5 made of titanium is provided. Thus, a MIM device 6 is constructed. On the upper electrode 5, a pixel electrode 7 made of ITO (Indium-Tin-Oxide) or the like is provided. The upper electrode 5 is electrically connected to the pixel electrode 7. The thus obtained active matrix substrate is attached to a counter substrate in such a manner that lines made of ITO or the like on the counter substrate are perpendicular to the signal lines 2, thereby forming a liquid crystal cell.

The conventional active matrix substrate having the above-described construction can be fabricated, for example, by the following method.

First, a thin tantalum film which will be the signal line 2 and the lower electrode 3 is deposited so as to have a thickness of 3000 angstroms on the glass substrate 1 by sputtering or the like. The thin tantalum film is patterned into a predetermined shape by photolithography, so as to form the signal line 2 and the lower electrode 3. Thereafter, by anodization, the surface of the lower electrode 3 is anodized, so as to form an insulating film 4 made of tantalum pentoxide and having a thickness of 600 angstroms. Next, titanium which will be the upper electrode 5 is deposited so as to have a thickness of 4000 angstroms by sputtering over the entire top surface of the substrate on which the above-mentioned components have been formed. The titanium is patterned into a predetermined shape by photolithography, so as to form the upper electrode 5. In addition, a transparent conductive film made of ITO or the like is deposited and then patterned, so as to form the pixel electrode 7.

As shown in FIG. 13, especially in the conventional anodization, in the case of the anodizing interconnection for forming the insulating film 4, a formation-voltage input portion 8 and an anodizing interconnection 22 to connection terminal portions 10 to 21 of a pattern 9 to be anodized both have plane shapes. The anodization is performed by using a power source of constant current and constant voltage. As shown in FIG. 14B, a constant-current formation (in general, 1 mA/cm² or more) is first performed. In the constant-current formation, the oxidation is performed while the formation current ($I_1$) is set to be constant. As shown in FIG. 14A, when the voltage reaches a value corresponding to a film thickness, a constant-voltage formation is performed at the voltage ($V_1$) for a predetermined time period.

In the above-described conventional anodizing method, there occurs a variation in display characteristics (Vop, Co, breakdown voltage, and the like) among various panel portions of a liquid crystal display apparatus. This causes a problem of nonuniformity of display.

The cause resides in the anodized film. More specifically, the thickness and the quality of the anodized film are not uniform among various panel portions. The relationship between an applied voltage V and a current I of a general two-terminal nonlinear device is expressed in the following equation.

$$I = \alpha V \exp(\beta \cdot V^{1/2})$$

$$\alpha = (n\mu q/d)\exp(-\phi/kT)$$

$$\beta = (1/kT)(q^3/\pi \epsilon_1 \epsilon_0 d)^{1/2}$$

n: carrier density, $\mu$: carrier mobility, q: charge amount of electron, d: thickness of anodized film, $\phi$: trap depth, k: Boltzmann constant T: ambient temperature, $\epsilon_1$: dielectric constant, and $\epsilon_0$: dielectric constant in vacuum.

As is apparent from the above equation, if the film thickness (d) and the film quality (n, $\mu$, $\phi$, and $\epsilon_1$) are changed, the I–V characteristics (the device characteristics) are changed. This results in the variation, i.e., the nonuniformity, of the display characteristics among the various panel portions. Moreover, in the conventional anodization method, the symmetry of the device structure (the anodized film) is lost, so that the I–V characteristic of the device is not symmetric. As a result, phenomena such as residual images occur in display conditions of the liquid crystal display apparatus. In addition, because of the asymmetric I–V characteristic there arises a variation in breakdown voltages depending on the voltage applying directions, that is, the breakdown voltage in either the positive or negative direction is lower than that in the other direction. This also results in a problem in that a device defect can easily occur.

SUMMARY OF THE INVENTION

In the method for fabricating a switching device of the invention in which an insulating film formed by anodization is interposed between a lower electrode and an upper electrode; when the insulating film is to be formed, the anodization is performed for a pattern to be anodized by using an anodizing interconnection of lines which connect a plurality of joint points provided between a formation-voltage input point and the pattern to be anodized to the formation-voltage input point. The anodizing interconnection of lines also connect the joint points to input points of the pattern so that formation voltages at the respective input points of the pattern are equal to each other.

According to another aspect of the invention, in the method for fabricating a switching device in which an insulating film formed by anodization is interposed between a lower electrode and an upper electrode, when the insulating film is to be formed, the anodization is performed for a pattern to be anodized by using a second interconnecting ring provided around a first interconnecting ring for anodization which is in contact with and encloses the pattern, and an anodizing interconnection consisting of a plurality of lines provided for inputting a formation voltage via a junction point connected to the second interconnecting ring and for making potentials between the junction points and the first interconnecting ring equal to each other.

According to another aspect of the invention, in the method for fabricating a switching device in which an insulating film formed by anodization is interposed between a lower electrode and an upper electrode, when the insulating film is to be formed, the anodization is performed for a pattern to be anodized by using an anodizing interconnection including a plurality of lines for inputting a formation voltage via a middle position on an outer circumference of the pattern at which at least two junction points provided at symmetric positions with respect to the pattern are connected to each other in the vicinity of an interconnecting ring for anodization; the interconnecting ring being in contact with and enclosing the pattern, and the plurality of lines being provided so that potentials between the first junction point and the interconnecting ring are equal to each other.

In one embodiment of the invention, a formation current density in a process for anodizing the pattern by using the anodizing interconnection is preferably set to be 1 mA/cm$^2$ or less.

In another embodiment of the invention, preferably during the anodization of the pattern by using the anodizing interconnection, a formation current is gradually increased for a predetermined time period until a formation voltage reaches a predetermined value. After the predetermined time period has elapsed, anodization of the pattern is performed while keeping the predetermined formation voltage, whereby a change of the formation current in the predetermined time period along a time axis is symmetric with respect to a change of the formation current along the time axis after the predetermined formation voltage is reached.

According to another aspect of the invention, the anodizing interconnection includes: a first interconnecting ring provided in contact with a pattern to be anodized, the first interconnecting ring enclosing the pattern; a second interconnecting ring provided around the first interconnecting ring; and a plurality of interconnecting lines connected to the first interconnecting ring at a plurality of positions of the second interconnecting ring which are symmetric with respect to a center of the first interconnecting ring.

According to another aspect of the invention, the anodizing interconnection includes: a first interconnecting ring provided in contact with a pattern to be anodized, the first interconnecting ring enclosing the pattern; a second interconnecting for connecting a plurality of junction points to each other on an outer circumference of the pattern, the plurality of junction points being provided at positions which are symmetric with respect to a center of the pattern; and a plurality of interconnecting lines, connected to the first interconnecting ring at a plurality of positions of the second interconnection which are symmetric with respect to a center of the first interconnecting ring.

In one embodiment of the invention, the plurality of interconnecting lines are preferably radially disposed from the plurality of corresponding positions toward the first interconnecting ring, and the interconnecting lines have equal resistances.

According to the invention, when an insulating film is to be formed the anodization of a pattern is performed by using an anodizing interconnection consisting of lines which are provided so that formation voltages at respective input points of the pattern are made equal to each other. By changing the shape of the anodizing interconnection from the plane shape to a shape including lines, the paths in which the formation current flows are made stable. Therefore, in order to equalize the wiring resistances to the pattern to be anodized, for example, line widths may be changed. As a result, the formation voltage and the formation current applied to various portions of the pattern to be anodized are uniform, so that the thickness and the quality of the anodized film in various panel portions are uniform. Accordingly, the device characteristics are uniform, and the internal structure of the device can be symmetric between the upper electrode side and the lower electrode side. In addition, the panel display characteristics (Vop, Co, breakdown voltage, and the like) can be uniform.

In order to equalize the wiring resistances to the pattern to be anodized, the anodizing interconnection specifically includes a first interconnecting ring for anodization which encloses a pattern to be anodized, a second interconnecting ring provided around the first interconnecting ring, and a plurality of anodizing lines provided so that potentials between the first interconnecting ring and the second interconnecting ring are equal to each other. Alternatively, the anodizing interconnection is constructed in such a manner that a formation voltage is input via a middle position on an outer circumference of the pattern at which at least two junction points provided at symmetric positions with respect to the pattern are connected to each other in the vicinity of an interconnecting ring for anodization which encloses the pattern to be anodized.

In addition, by setting the formation current density in the anodization to be 1 (mA/cm$^2$) or less, the metal ion concentration in the anodized film is made uniform, and the internal structure of the device can be symmetric. By applying a formation current in the anodization in a symmetric manner with respect to a time elapse, the sizes of crystal grains in the anodized film can be symmetric between the lower electrode side and the upper electrode side, so that the internal structure of the device is made symmetric. Accordingly, the I–V characteristic of the device is symmetric, thereby eliminating residual images in the panel display. In addition, there is no difference in breakdown voltages depending on the voltage applying directions (a breakdown voltage in either positive or negative direction is not lower than that in the other direction), so that it is difficult for device defects to occur.

Thus, the invention described herein makes possible the advantage of providing a method for fabricating a switching device, by which switching characteristics and display characteristics of a liquid crystal display apparatus or the like utilizing the switching characteristics can be made uniform.

This and other advantages of the present invention will become apparent to those skilled in the art upon reading and understanding the following detailed description with reference to the accompanying figures.

DESCRIPTION OF THE PREFERRED EMBODIMENTS

First, the problems of an anodized film which is obtained by a conventional method are studied. Thereafter, examples of the invention will be described.

Figure 15:
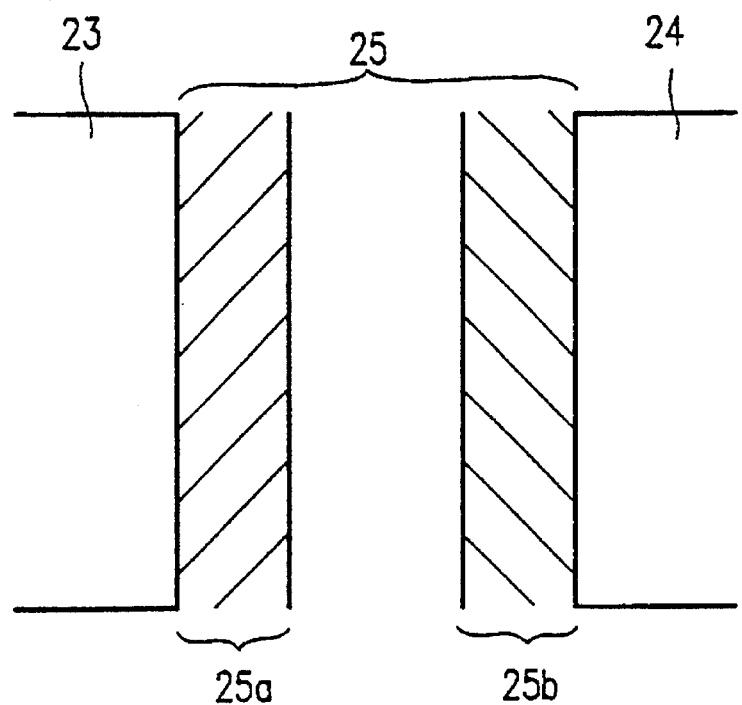
FIG. 15 is a diagram showing a distribution of metal ions in a conventional anodized film which has been studied by the inventors of the present invention.

As shown in FIG. 15, in a switching device including an anodized film obtained by a conventional method, an anodized film 25 is interposed between a lower electrode 23 and an upper electrode 24. In a side portion of the anodized film 25 closer to the lower electrode 23, a region 25a including excessive metal ions and being short of oxygen ions is formed. In the other side portion of the anodized film 25 closer to the upper electrode 24, a region 25b being short of metal ions and including excessive oxygen ions is formed. As a result, the metal ions exhibit a predetermined concentration gradient from the region 25a to the region 25b. The inventors of the present invention consider that the concentration gradient occurs because the formation current density is 1 ($mA/cm^2$) or more, so that the metal ions cannot be sufficiently diffused and moved in the oxide film during the anodization.

Figure 16:
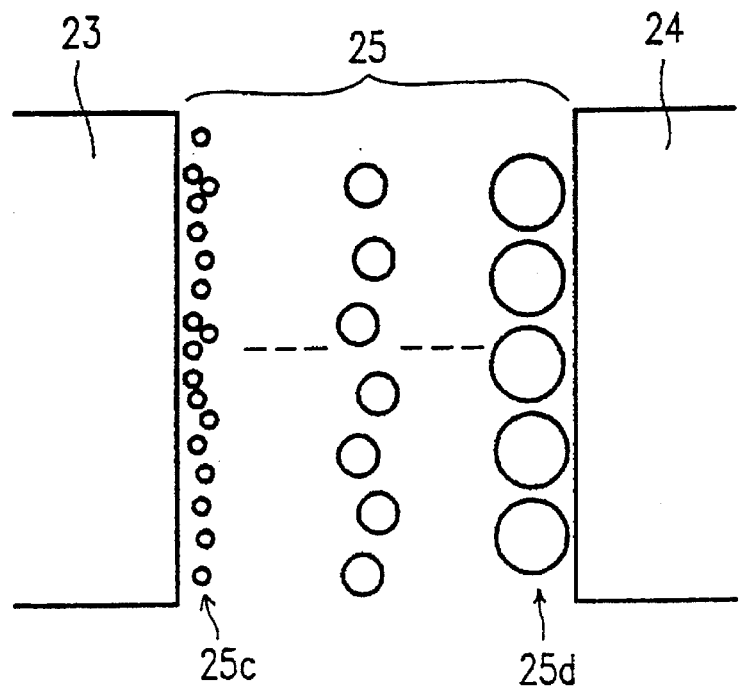
FIG. 16 is a diagram showing a distribution of particle diameters in the conventional anodized film which has been studied by the inventors of the present invention.

In addition, according to the conventional anodization method as shown in FIG. 16, the value of a formation current in the constant-voltage formation is varied, so that the growth rate of crystal is varied. First, in the side portion of the anodized film 25 closer to the lower electrode 23, the current density is high, so that the ion discharge occurs rapidly, and the growth rate of crystal is lower than the generation rate of new seeds. As a result, a large number of small crystal grains are generated so as to form a uniform and dense film 25c. In the side portion of the anodized film 25 closer to the upper electrode 24, the current density is low, so that the ion discharge occurs weakly, and the growth rate of crystal is higher than the generation rate of new seeds. As a result, a coarse film 25d including coarse and large crystal grains is formed. Accordingly, the sizes of crystal grains in the anodized film 25 are gradually varied from the side portion closer to the lower electrode 23 to the side portion closer to the upper electrode 24.

Figure 13:
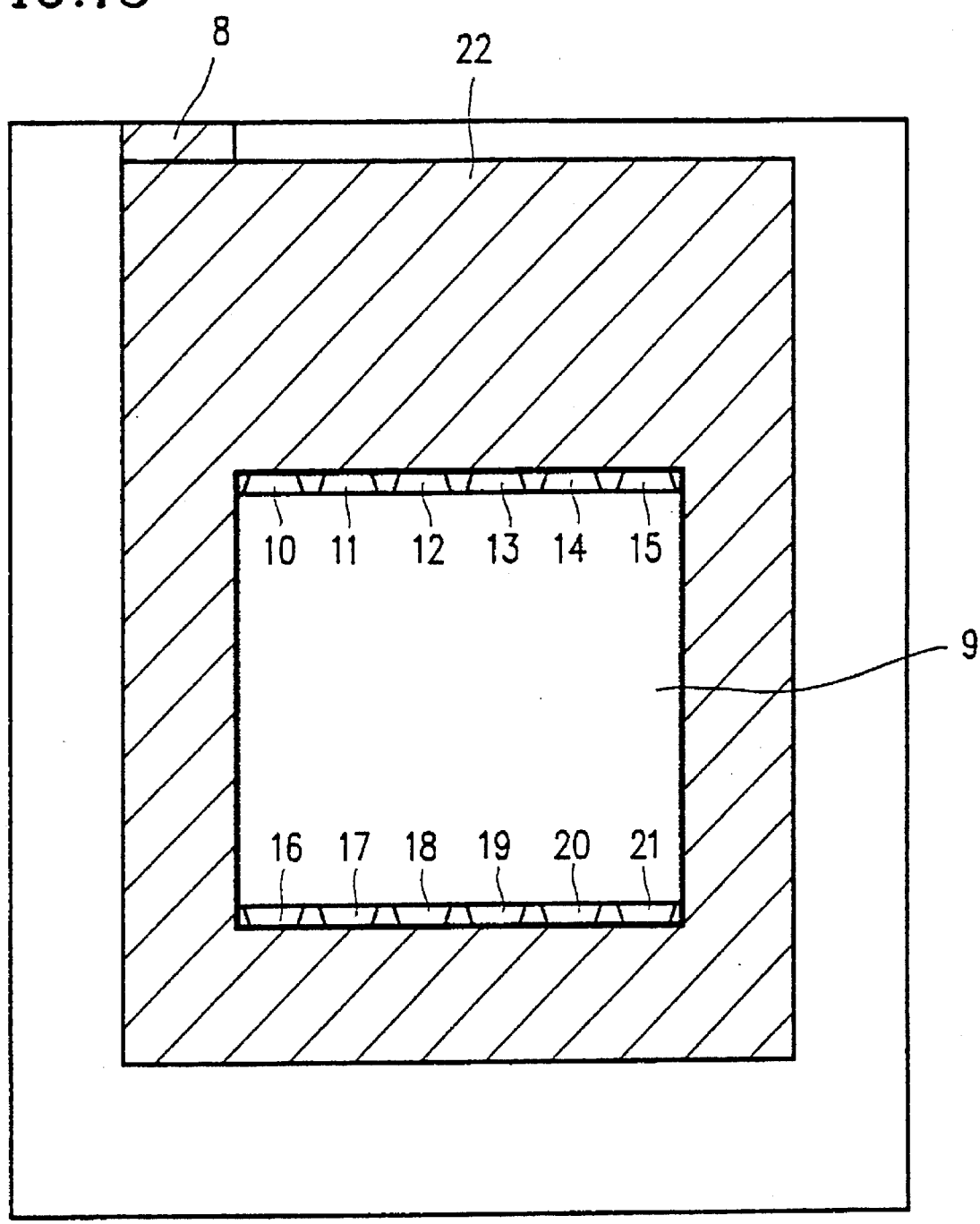
FIG. 13 is a diagram showing an anodizing interconnection in a conventional method for fabricating a switching device.

The above-mentioned problems occur fundamentally because of the nonuniformity of the anodized film 25 in various panel portions. More specifically, as shown in FIG. 13, since an anodizing interconnection 22 from a formation-voltage input portion 8 to connection terminal portions 10 to 21 of a pattern 9 to be anodized has a plane shape, the formation current in the anodization does not flow in stable paths so that the current does not uniformly flow into the respective connection terminal portions 10 to 21 of the pattern 9 to be anodized. As a result, the anodization is not uniformly performed. In addition, since the resistance values in the plane-shape anodizing interconnection 22 from the formation-voltage input portion 8 to the respective connection terminals 10 to 21 of the pattern 9 are not equal to each other, there occurs a variation in formation voltage to be applied to the respective connection terminal portions 10 to 21 in the anodization. As a result, the thickness of the anodized insulating film is not uniform.

Figure 14A:
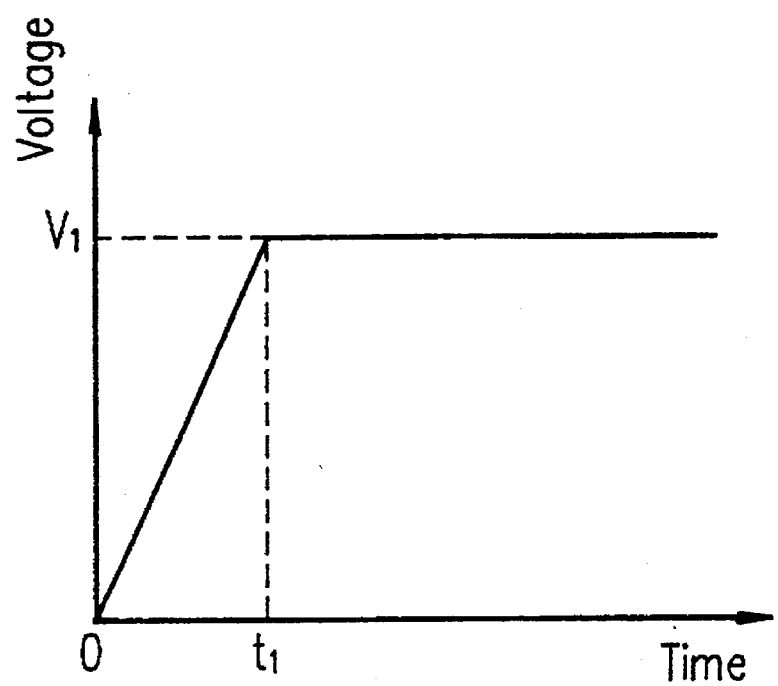
FIG. 14A is a graph showing a relationship between time and a formation voltage in conventional anodization.
Figure 14B:
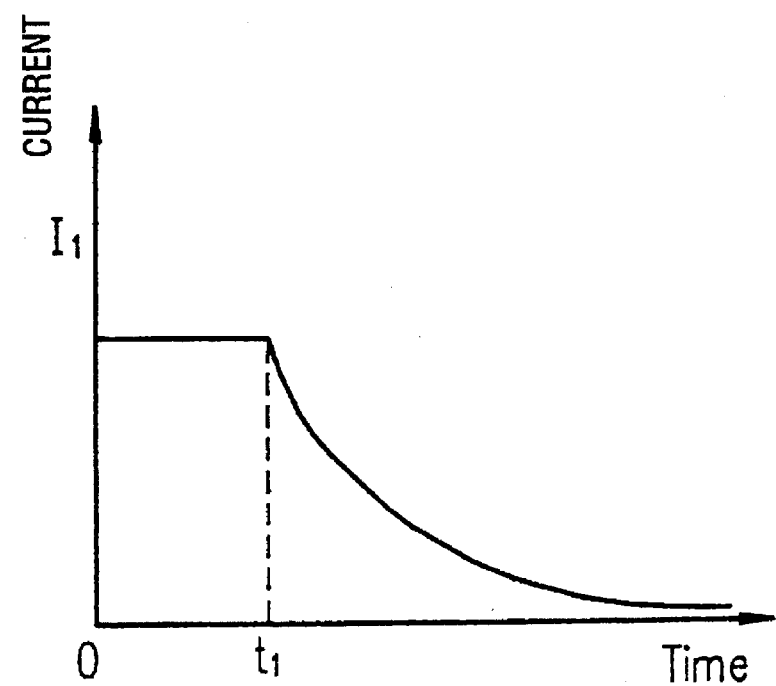
FIG. 14B is a graph showing a relationship between time and a formation current in the conventional anodization.

The nonuniformity in the insulating film of the anodized film 25 occurs for the following reasons. As shown in FIG. 14B, the value of the formation current is varied from the start to the end of the anodization, so that the crystal grains have different sizes between the side portion of the anodized film 25 closer to the lower electrode 23 and the side portion closer to the upper electrode 24. That is, the film quality is varied.

Hereinafter, the present invention which has been conducted in view of the above-mentioned studies will be described.

Figure 1:
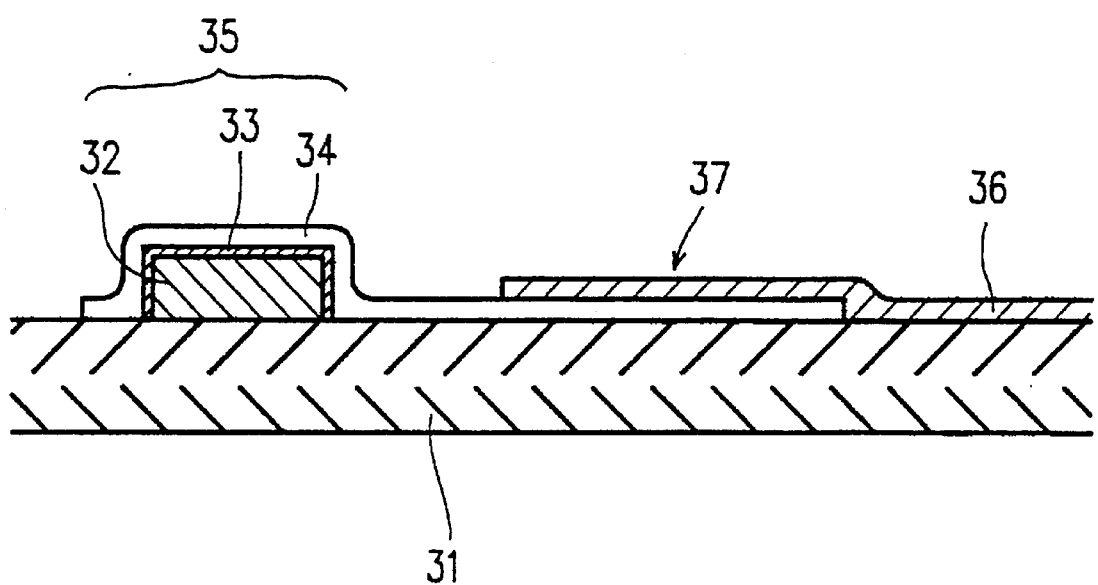
FIG. 1 is a cross-sectional view of a two-terminal non-linear device and a pixel electrode portion for explaining a method for fabricating an active matrix substrate in one example of the invention.

FIG. 1 is a cross-sectional view of a two-terminal non-linear device and a pixel electrode portion for illustrating a method for fabricating an active matrix substrate in one example of the invention. In FIG. 1, a thin tantalum film which will be a signal line and a lower electrode 32 branched from the signal line is deposited so as to have a thickness of 3000 angstroms on a glass substrate 31 by sputtering or the like. The thin tantalum film is patterned into a predetermined shape by photolithography, so as to form the signal line and the lower electrode 32. Thereafter, the surface of the lower electrode 32 is anodized by an anodization method according to the invention so as to form an insulating film 33 having a thickness of 600 angstrom and made of tantalum pentoxide. The insulating film 33 has a uniform thickness and a uniform quality.

Figure 2A:
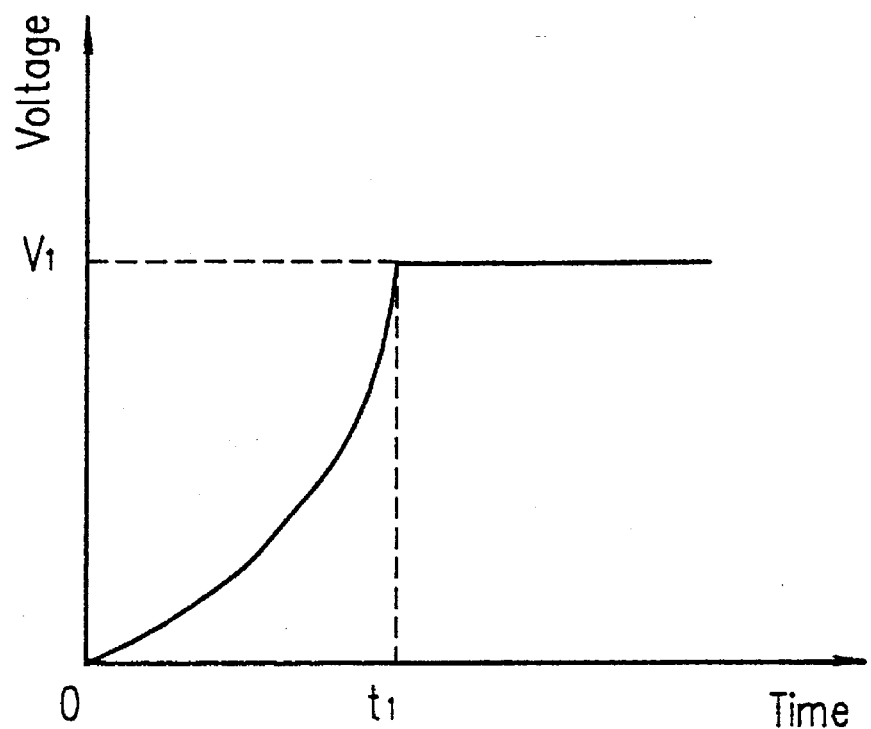
FIG. 2A is a graph showing a relationship between time and a formation voltage in anodization according to the invention.
Figure 2B:
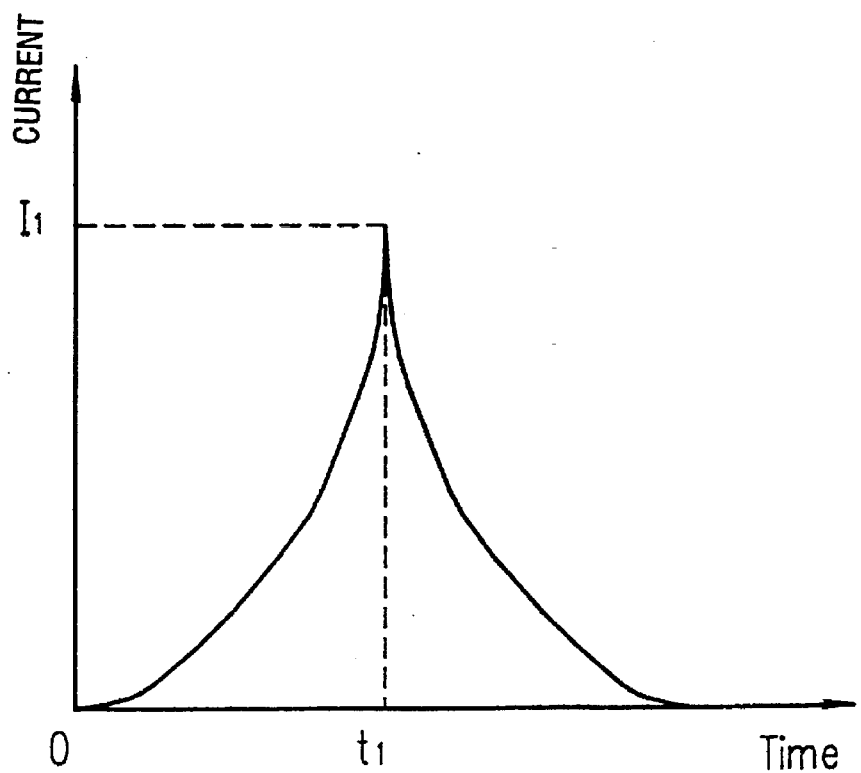
FIG. 2B is a graph showing a relationship between time and a formation current in the anodization according to the invention.

Specifically, a pattern is anodized by using an anodizing interconnection which will be described later. As shown in FIGS. 2A and 2B; first, a formation current is gradually increased by an adjustable power source of constant voltage until a formation voltage reaches a predetermined value $V_1$ as shown in FIG. 2A (a voltage corresponding to the film thickness). When the voltage reaches the predetermined value, the anodization is performed while maintaining the predetermined voltage $V_1$. During time 0 to $t_1$, as shown in FIG. 2B, the formation current gradually increases and the change of the formation current along the time axis exhibits a symmetric characteristic with respect to time point $t_1$ at which the anodization and increased resistance of the insulation film 33 is started at the constant voltage $V_1$. It is preferred that the formation current density in the anodization process is set to be 1 mA/cm$^2$ or less. Accordingly, the concentration of metal ions in the anodized film can be uniform and the distribution of the crystal grain size in the anodized film can be symmetric in the thickness direction.

By sputtering or the like, over the entire top surface of the substrate on which the above-described components have been formed, titanium which will be an upper electrode 34 is deposited so as to have a thickness of 4000 angstroms. The titanium is patterned into a predetermined shape by photolithography, so as to form the upper electrode 34. As a result, a MIM device 35 as a switching device is obtained. In the MIM device 35, the insulating film 33 which is obtained by anodization is interposed between the lower electrode 32 and the upper electrode 34. Then, a transparent conductive film made of ITO or the like is deposited and patterned, so as to form a pixel electrode 36. In this way, an active matrix substrate 37 of a liquid crystal display apparatus having the MIM device 35 as a switching element is obtained.

The anodized film, i.e., the insulating film 33 functions as a functional film in the MIM device 35 as the two-terminal nonlinear device. Accordingly, if the thickness and the quality of the anodized film are changed, the I–V characteristics of the device are also changed. If the device characteristics are changed, the panel display characteristics are changed. For this reason, in order to make the display characteristics uniform, it is also necessary to make the device characteristics uniform. Accordingly, the formation of the anodized film as the insulating film 33 having a uniform thickness and a uniform quality is an important process, and hence a method for forming an anodized film will be described below in detail.

Figure 3:
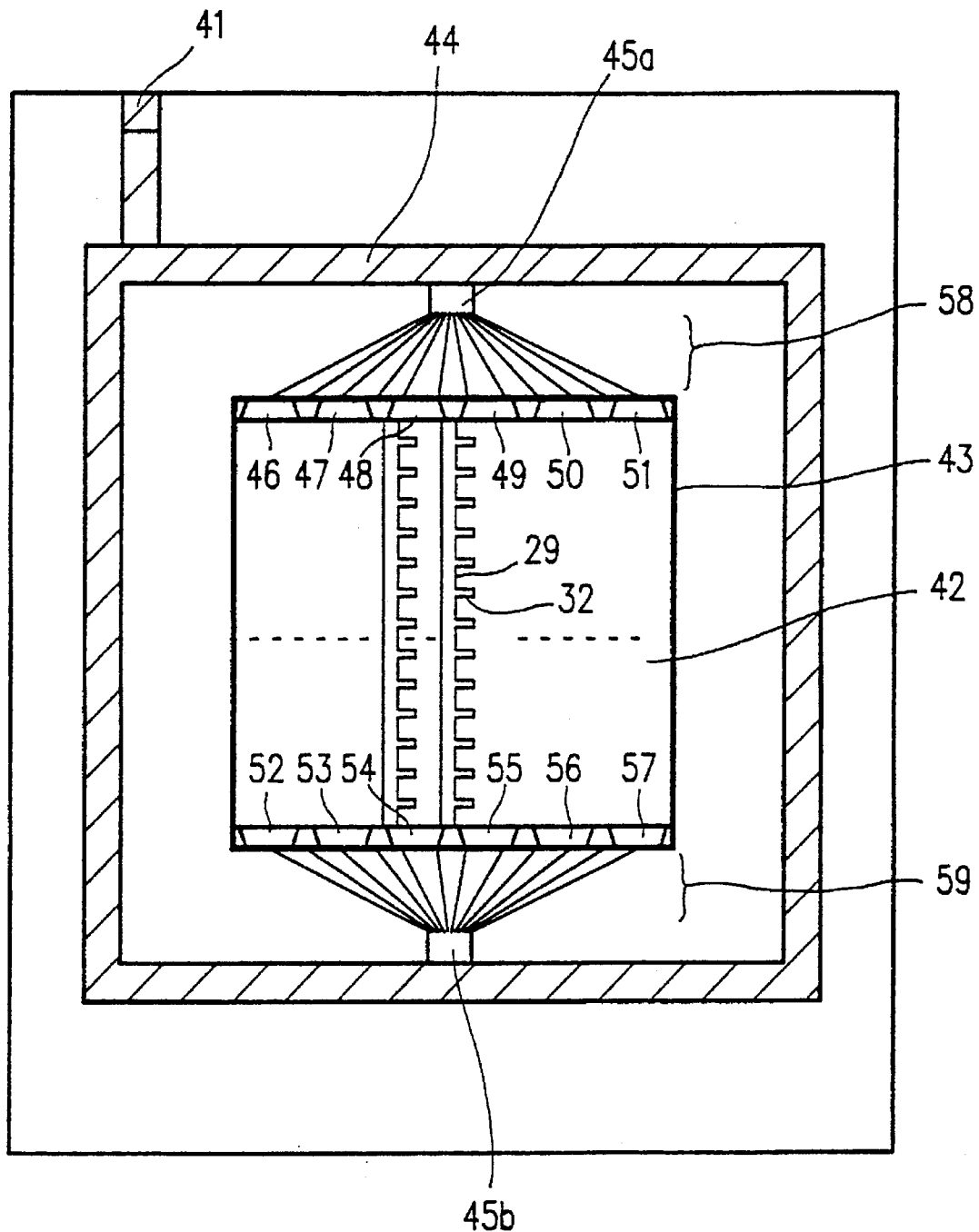
FIG. 3 is a diagram showing an anodizing interconnection according to a method for fabricating a switching device in one example of the invention.

FIG. 3 is a diagram showing an anodizing interconnection according to a method for fabricating a switching device in one example of the invention. As shown in FIG. 3, between one formation-voltage input point 41 and a pattern 42 to be anodized, an interconnecting ring (a short ring) 43 for anodization is provided. The interconnecting ring 43 is in contact with and encloses the pattern 42. The pattern 42 is constituted of a plurality of signal lines 29 which are disposed at predetermined intervals. Both ends of each of the signal lines 29 are connected to the interconnecting ring 43. A plurality of lower electrodes 32 are connected to each of the signal lines 29. In the pattern 42, the lower electrodes 32 are arranged in a two-dimensional array. In general, the pattern 42 corresponds to a pattern required for forming one panel of a liquid crystal display apparatus.

An interconnecting ring 44 is provided so as to enclose the interconnecting ring 43. The interconnecting ring 44 is connected to the formation-voltage input point 41. Two junction points 45a and 45b are connected to the interconnecting ring 44 at vertically symmetric positions with respect to the pattern 42. The respective junction points 45a and 45b are coupled to the interconnecting ring 43 by thin-line groups 58 and 59 each including a plurality of leading thin lines. Upper connection terminals 46 to 51 and lower connection terminals 52 to 57 of the pattern 42 are connected to the interconnecting ring 43. The thin-line groups 58 and 59 are radially disposed from the respective junction points 45a and 45b to the interconnecting ring 43, so that the formation voltages at respective input points of the upper connection terminals 46 to 51 and the lower interconnection terminals 52 to 57 are made to be equal to each other. In the thin-line groups 58 and 59, the thin lines which have shorter lengths toward the center thereof have narrower widths, so that the resistance values of the respective thin lines are made equal to each other.

The interconnecting rings 43 and 44 and the thin-line groups 58 and 59 are formed on the glass substrate 31 (FIG. 1). In the case where they are formed as a metal interconnection pattern, the pattern is made of Ta, Ti, ITO, or Al. In the case where they are formed as a conductive paste pattern, the pattern is made of a paste of Au, Ag, Cu, Al, Ni, or C. When the conductive paste is used, the anodized film is formed by using an anodizing interconnection which also functions as a passivation film for a non-anodized portion of the pattern 42 to be anodized.

Figure 4:
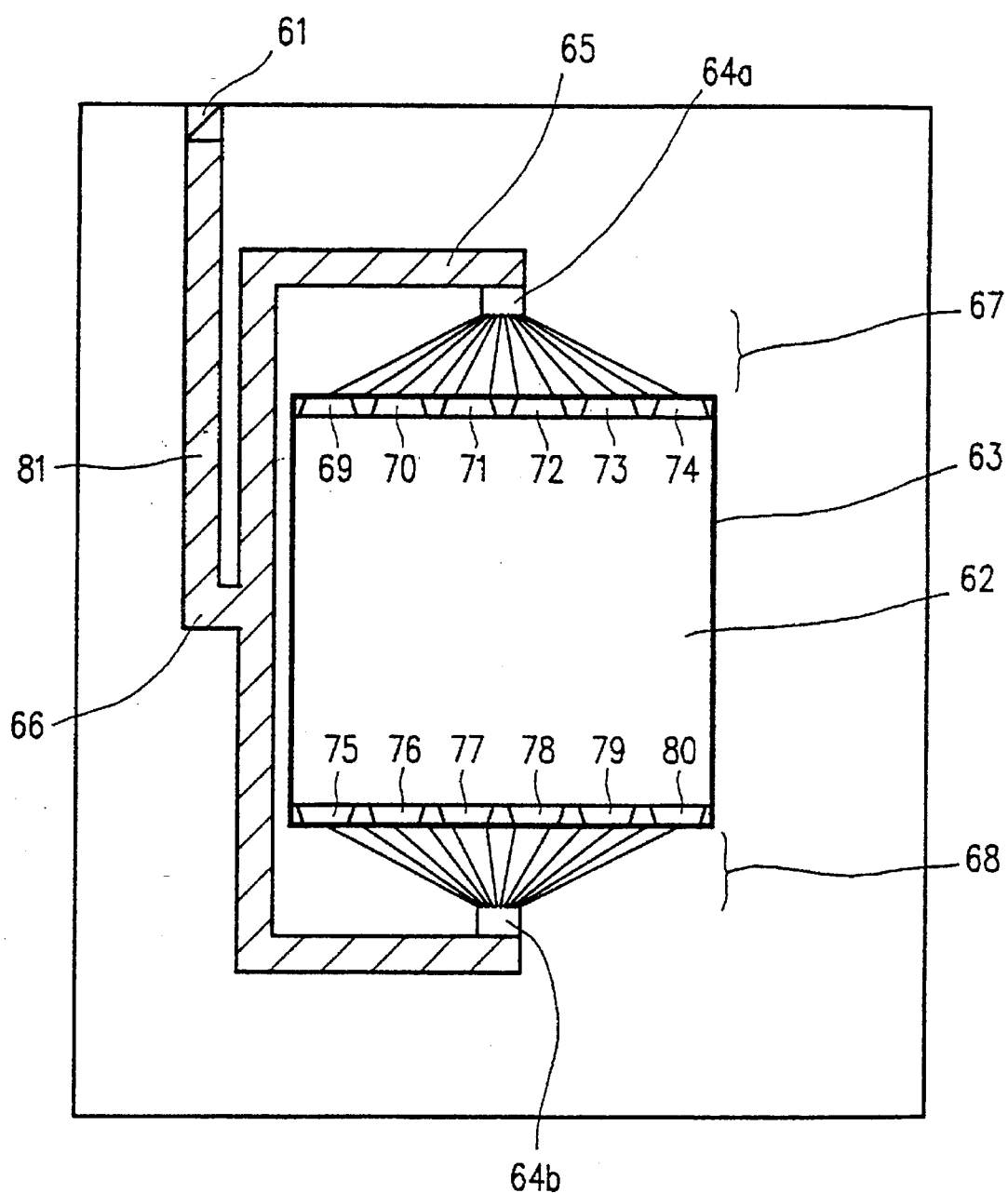
FIG. 4 is a diagram showing an anodizing interconnection according to a method for fabricating a switching device in another example of the invention.

FIG. 4 is a diagram showing an anodizing interconnection according to a method for fabricating a switching device in another example of the invention. As shown in FIG. 4, between one formation-voltage input point 61 and a pattern 62 to be anodized, an interconnecting ring (short ring) 63 for anodization is provided. The interconnecting ring 63 is in contact with and encloses the pattern 62. Two junction points 64a and 64b are provided at vertically symmetric positions with respect to the pattern 62. These two junction points 64a and 64b are connected by a pattern outer circumferential interconnection 65, and a junction point 66 is disposed at a position which is equally distant from the junction points 64a and 64b. The junction points 64a and 64b are connected to the interconnecting ring 63 by thin-line groups 67 and 68, respectively, so that the potentials therebetween are equal to each other. Each of the thin-line groups 67 and 68 includes a plurality of leading thin lines. The thin-line group 67 is an interconnection between the junction point 64a and terminal portions 69 to 74. The thin-line group 68 is an interconnection between the junction point 64b and terminal portions 75 to 80. The junction point 66 is connected to the junction points 64a and 64b by one continuous pattern outer circumferential interconnection 65. The junction point 66 is connected to the formation-voltage input portion 61 having a very small area by one anodizing interconnection 81.

The material for the interconnecting ring 63, the pattern outer circumferential interconnection 65, the thin-line groups 67 and 68, and the interconnection 81 is a metal selected from a group of Ta, Ti, ITO, Al, and the like in the case of a metal interconnection pattern, or a paste selected from a group of Au, Ag, Cu, Al, Ni, C, and the like in the case where a conductive paste is used. In the case of the conductive paste, an anodized film is formed by the anodizing interconnection which also functions as a passivation film for a non-anodized portion of the pattern 62 to be anodized.

Figure 5:
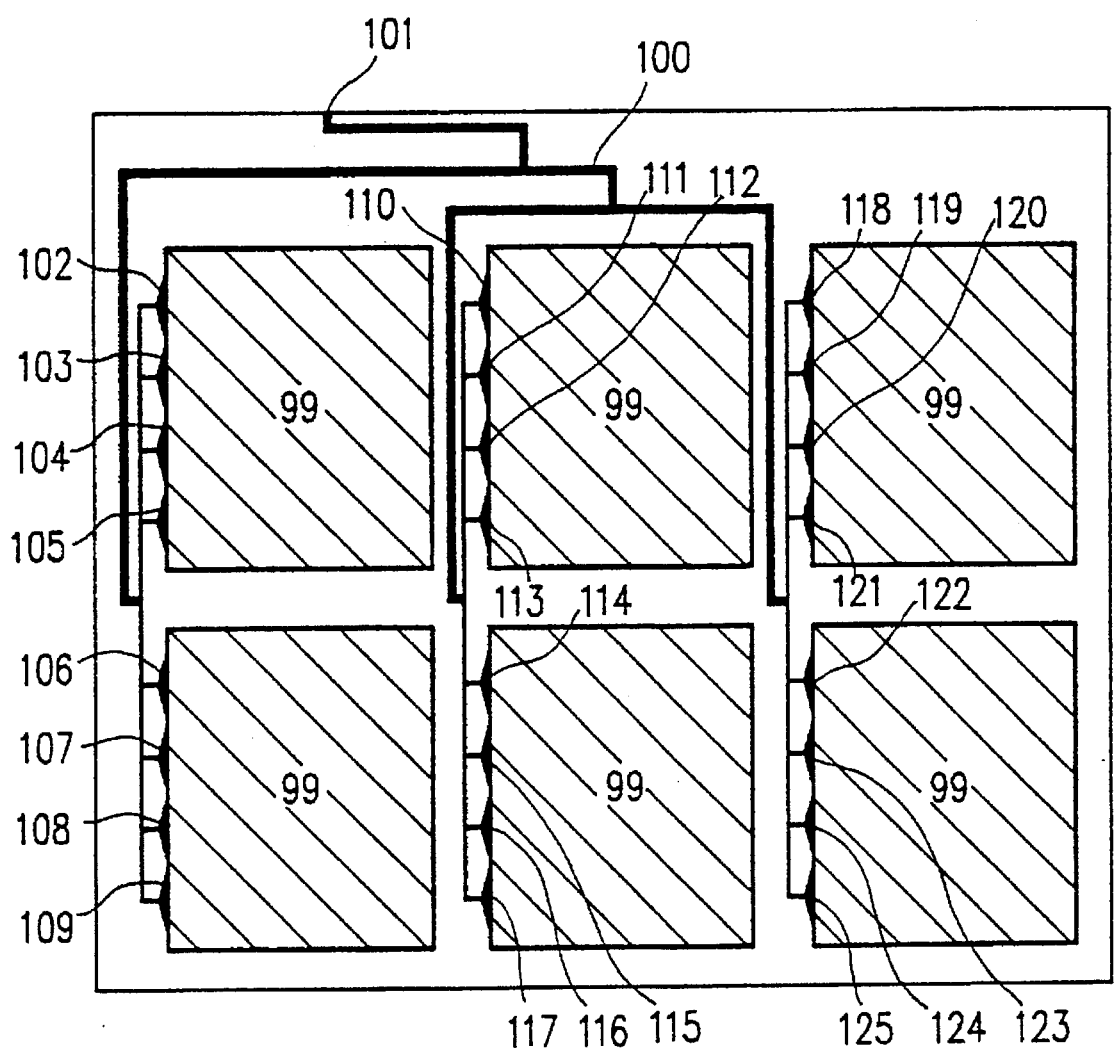
FIG. 5 is a diagram showing an anodizing interconnection according to a method for fabricating a switching device in still another example of the invention.
Figure 6:
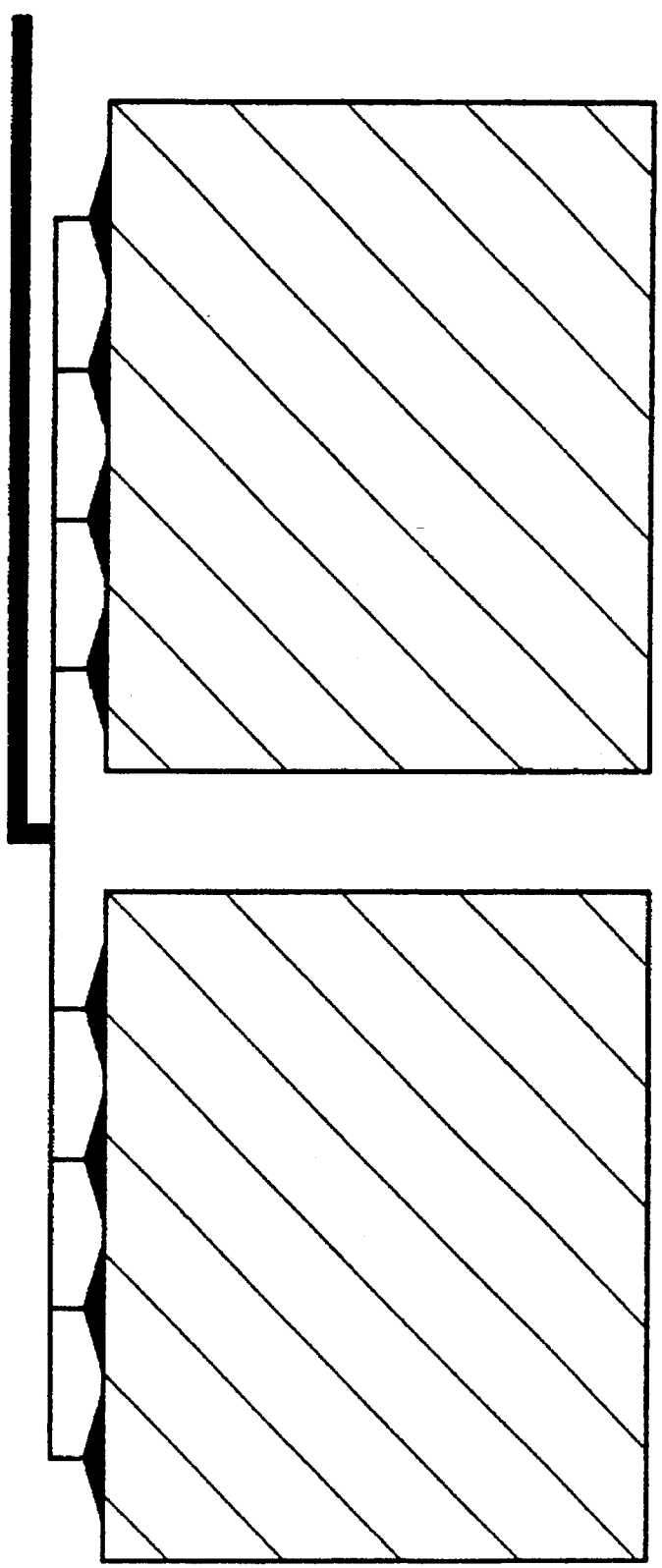
FIG. 6 is a partially enlarged view in the vicinity of a terminal portion shown in FIG. 5.

FIG. 5 is a diagram showing an anodizing interconnection according to a method for fabricating a switching device in still another example of the invention. FIG. 6 is a partially enlarged view in the vicinity of terminal portions in FIG. 5. In FIGS. 5 and 6, if a plurality of patterns 99 are to be anodized (in this example, six patterns 99 are anodized), an anodizing interconnection 100 connects a formation-voltage input portion 101 to respective connection terminal portions 102–105, 106–109, 110–113, 114–117, 118–121, and 122–125, so that the resistances therebetween are equal to each other.

The material for the anodizing interconnection 100 is a metal selected from a group of Ta, Ti, ITO, and the like in the case of a metal interconnection pattern, or a paste selected from a group of Au, Ag, Cu, Al, Ni, C, and the like in the case of a conductive paste. In the case of the conductive paste, the anodized film is formed by the anodizing interconnection which also functions as a passivation film for a non-anodized portion of the pattern 99 to be anodized.

Results obtained by forming an anodized film by using the above-described anodizing interconnection are shown below.

If an anodized film having a thickness of 600 angstroms is formed, the variation in thickness of the anodized film in a panel formed by one pattern is 50 angstroms or more according to the prior art, but the variation in thickness can be suppressed to be 30 angstroms or less according to the present invention.

As for the dielectric constant of the anodized film, a variation of 3 or more is caused with respect to the dielectric constant of 25 according to the prior art, but, the variation can be suppressed to be 1 or less according to the present invention. Therefore, the device characteristics of various panel portions are made uniform, so that the display characteristics (Vop, Co breakdown voltage, and the like) are made uniform. Since the device characteristics are uniform, the breakdown voltage of the device is also uniform. Accordingly, the number of devices having lower breakdown voltages is reduced, so that the number of defective devices can be reduced to 50% or less as compared with the prior art.

Figure 7:
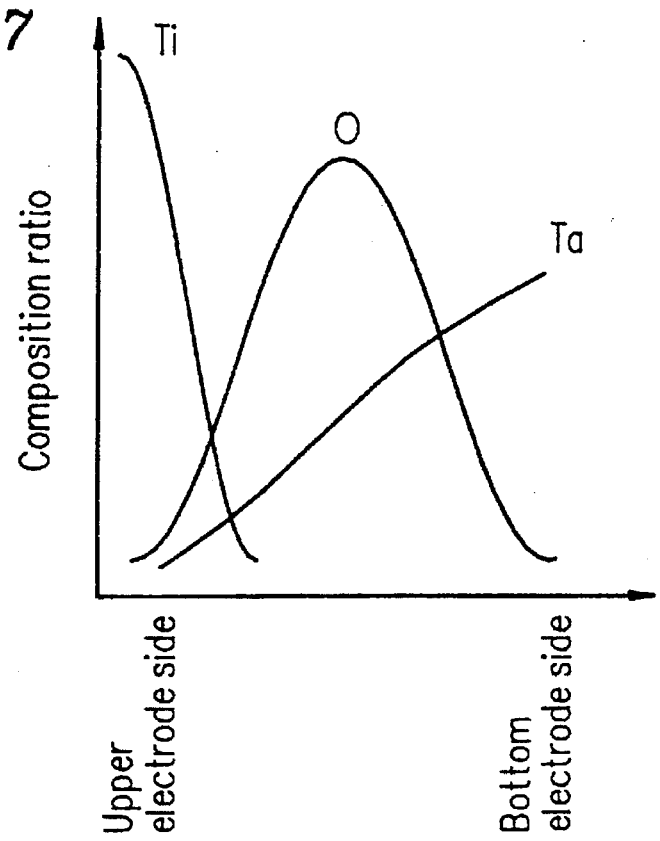
FIG. 7 is a graph showing a distribution condition of Ta in a conventional anodized film.
Figure 8:
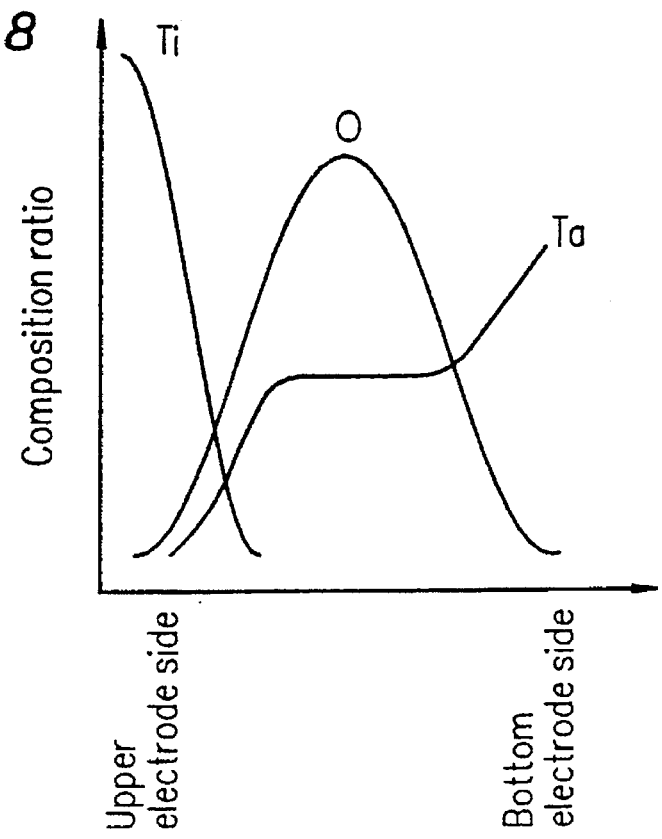
FIG. 8 is a graph showing a distribution condition of Ta in an anodized film according to the invention.
Figure 9:
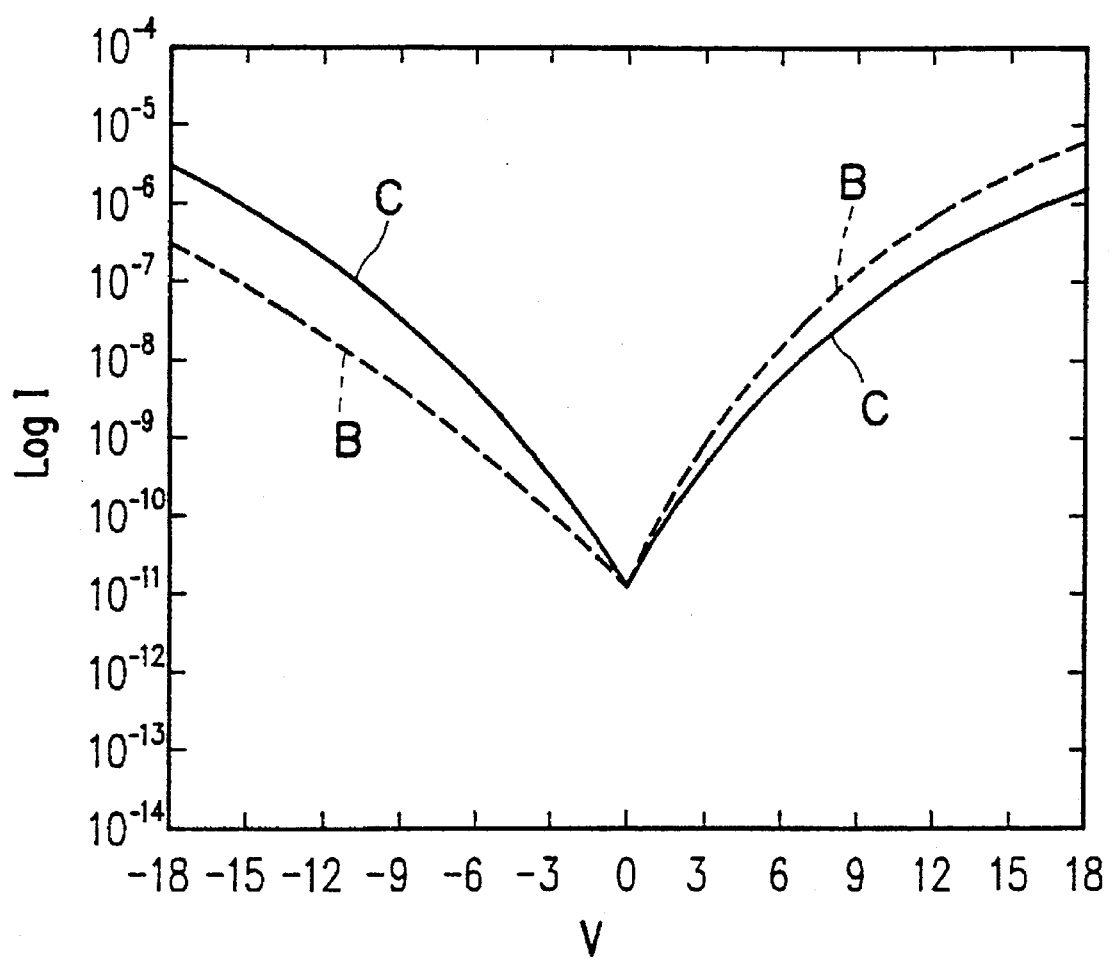
FIG. 9 is a diagram showing the I–V characteristic of switching devices according to a prior art and the present invention.

According to the conventional method, the distribution of Ta ions in the anodized film is not uniform as shown in FIG. 7, so that the I–V characteristic of the device indicated by broken line B in FIG. 9 is asymmetric between the positive side and the negative side of the voltage. On the other hand, according to the present invention, as shown in FIG. 8; the distribution of Ta ions in the anodized film is uniform, so that the I–V characteristic of the device indicated by solid line C in FIG. 9 is symmetric between the positive side and the negative side of the voltage. Accordingly, the breakdown voltages of the device on the positive side and the negative side have little difference. That is, one of the breakdown voltages on the positive side and the negative side is not lower than that on the other side. As a result, the number of defective devices can be reduced to 50% or less as compared with the prior art.

The evaluation results of the device defects are shown below in Table 1.

TABLE 1

| Formation current density | Number of defective devices |
|---|---|
| 1.5 mA/cm$^2$ | >30 |
| 1.2 mA/cm$^2$ | 3–30 |
| 0.5 mA/cm$^2$ | 0–3 |
| 0.15 mA/cm$^2$ | 0 |
| 0.02 mA/cm$^2$ | 0 |
| 0.002 mA/cm$^2$ | 0 |

It is seen from Table 1 that the lower the formation current density is, the smaller the number of defective devices becomes. The inventors of the invention consider the reasons for this fact are as follows. Since the formation of the anodized film is slowly performed, Ta ions in the film exist in stable conditions, so that it is difficult for the ions to move in the film after the formation of the film. If the Ta ions move, the anodized film is damaged. This results in a device defect.

Figure 10:
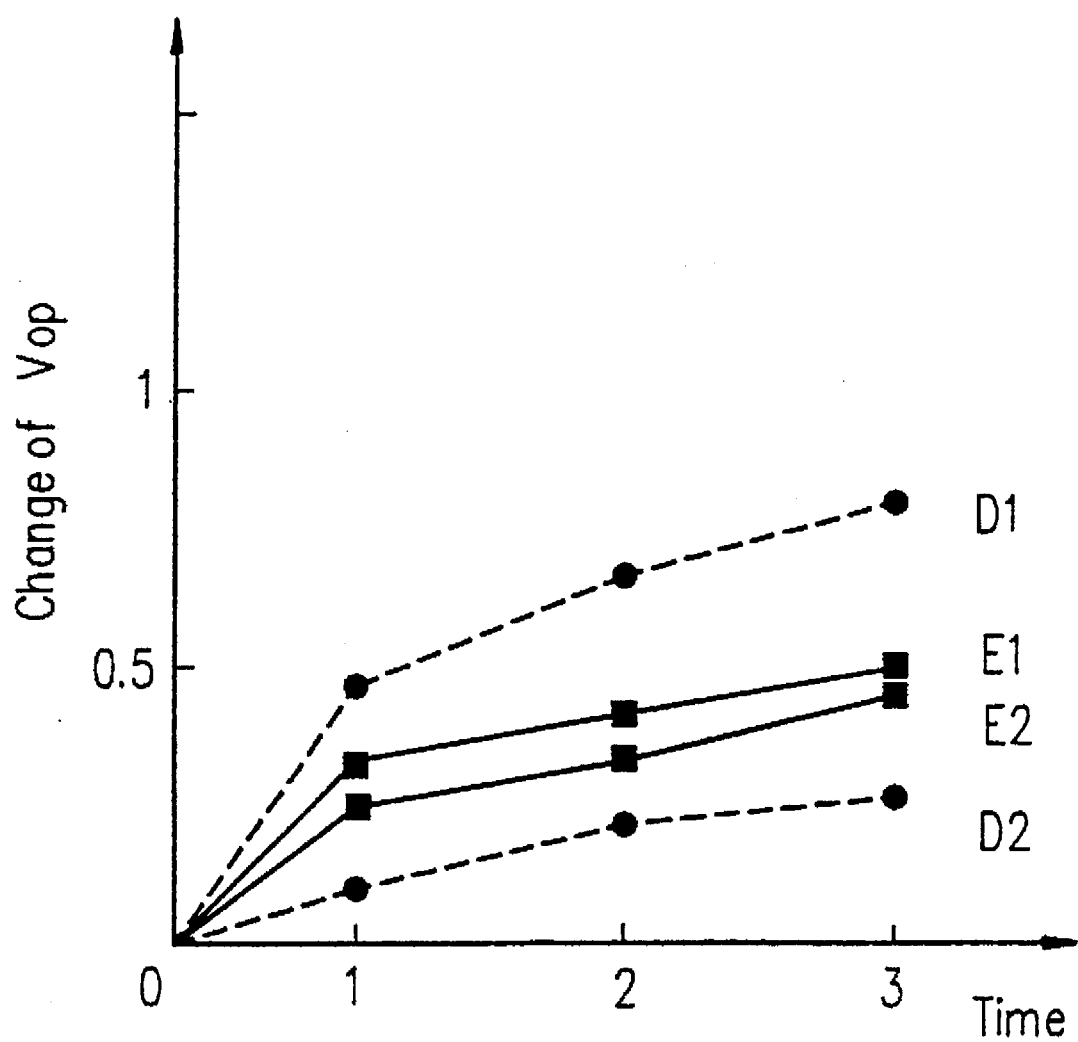
FIG. 10 is a graph showing changes in an electric characteristic (Vop) in a long time application of formation voltage according to a prior art and the present invention.
Figure 11:
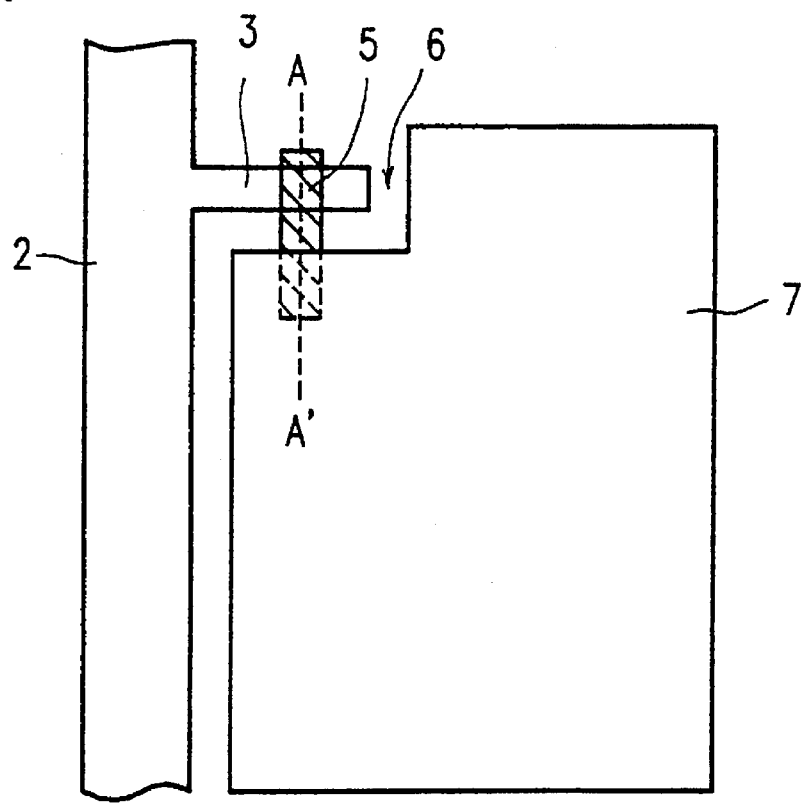
FIG. 11 is a plan view showing a construction of a one-pixel portion in a conventional active matrix substrate.
Figure 12:
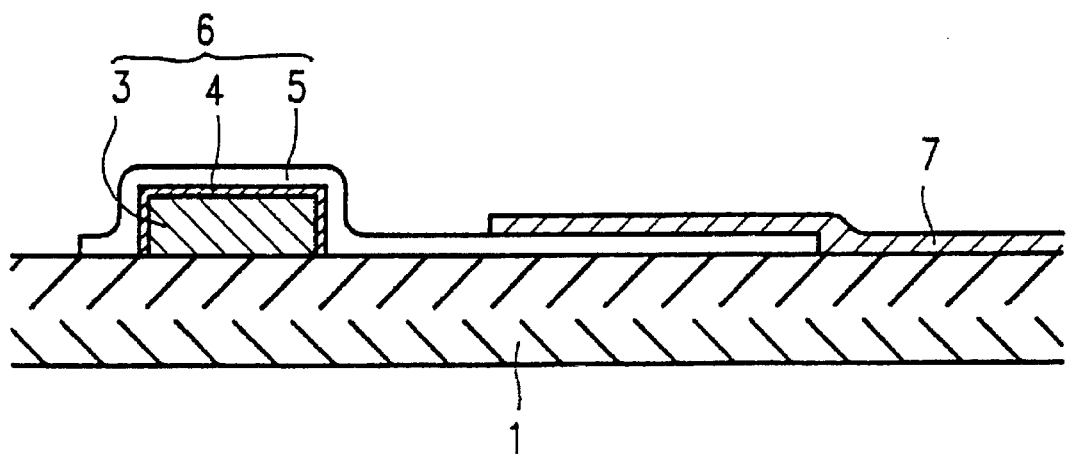
FIG. 12 is a cross-sectional view taken along a line A–A' in the active matrix substrate shown in FIG. 11.

In addition, in order to evaluate the residual images in a display in a panel utilizing the device of the invention, a voltage is applied for a long time. Then, the shift of the electric characteristic (Vop) between a panel lightening portion (a pattern display portion) and a panel non-lightening portion (a pattern non-lightening portion) is measured. According to the conventional method, there occurs a shift difference between a lightening portion D1 and a non-lightening portion D2 as indicated by broken line in FIG. 10, so that residual images are observed in the display. According to the method of the invention, there is little shift difference between a lightening portion E1 and a non-lightening portion E2 as indicated by solid line in FIG. 10, so that residual images are not observed in the display.

In the above-described examples of anodizing interconnections, the interconnecting rings 43 and 63 are used. Alternatively, the interconnecting rings 43 and 63 may be omitted. In such a case, the anodized film may be formed by using an anodizing interconnection in which the lines to the connection terminals 46 to 57 and 69 to 80 are continuously connected by the thin-line groups 58 and 59, and the thin-line groups 67 and 68, respectively.

In the above-described examples of anodizing interconnections, two junction points 45a and 45b or two junction points 64a and 64b are disposed at vertically symmetric positions with respect to the pattern 42 and the pattern 62, respectively. Alternatively, two junction points may be disposed at horizontally symmetric positions. Also, a plurality of junction points may be provided around the pattern 42 or the pattern 62.

In the above-described examples of anodizing interconnections; by using the source of constant current and constant voltage for the anodizing interconnection, the formation current density in the anodizing process is set to 1 (mA/cm$^2$) or less. More preferably, a constant-current anodization is performed with a formation current density of 0.5 (mA/cm$^2$) or less. After a predetermined voltage (a voltage corresponding to the film thickness) is reached, a constant-voltage anodization is performed, thereby forming an anodized film. In this case, the metal ion concentration in the anodized film is made to be more uniform, and therefore the internal structure of the device can be more symmetric.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for fabricating a switching device in which an insulating film formed by anodization is interposed between a lower electrode and an upper electrode, the method comprising a step for forming an insulating film on a defined pattern on a substrate by anodization, wherein the anodization is performed using an interconnection of lines which connect a plurality of joint points provided between a formation-voltage input point and the pattern to be anodized to the formation-voltage input point and which connect the joint points to input points of the pattern, and wherein formation voltages supplied to the respective input points of the pattern are substantially equal to each other, and during the anodization of the pattern, an anodizing current is gradually increased for a time period until an anodizing voltage reaches a chosen value, and after the time period has elapsed, anodization of the pattern is performed while maintaining the chosen anodization voltage, so that the change of the anodizing current in the time period along a time axis is symmetric with respect to the change of the anodizing current along the time axis after the chosen anodizing voltage is reached.

2. A method for fabricating a switching device according to claim 1, wherein an anodizing current density is set to be 1 mA/cm$^2$ or less.

3. A method for fabricating a switching device in which an insulating film formed by anodization is interposed between a lower electrode and an upper electrode, the method comprising a step for forming an insulating film on a defined pattern on a substrate by anodization, wherein the anodization is performed using first and second interconnecting rings, the first interconnecting ring being in contact with the pattern and enclosing the pattern, the second interconnecting ring being provided around the first interconnecting ring and being connected to a junction point, a plurality of lines connecting the junction point to the first interconnecting ring, for inputting to the pattern an anodizing voltage via the second interconnecting ring and for making potentials of the junction point and the first interconnecting ring equal to each other.

4. A method for fabricating a switching device according to claim 3, wherein an anodizing current density is set to be 1 mA/cm$^2$ or less.

5. A method for fabricating a switching device according to claim 3, wherein during the anodization of the pattern, an anodizing current is gradually increased for a time period until an anodizing voltage reaches a chosen value, and after the time period has elapsed, anodization of the pattern is performed while maintaining the chosen anodization voltage, so that the change of the anodizing current in the time period along a time axis is symmetric with respect to the change of the anodizing current along the time axis after the chosen anodizing voltage is reached.

6. A method for fabricating a switching device in which an insulating film formed by anodization is interposed between a lower electrode and an upper electrode, the method comprising a step for forming an insulating film on a defined pattern on a substrate by anodization, wherein the anodization is performed using an outer circumferential interconnection which interconnects at least two junction points provided at symmetric positions with respect to the pattern, an interconnecting ring which is in contact with the pattern and encloses the pattern, and a plurality of lines connecting each junction point to the interconnecting ring, for inputting to the pattern an anodizing voltage via a middle position of said outer circumferential interconnection between said junction points so that potentials between the junction points and the interconnection ring are equal to each other.

7. A method for fabricating a switching device according to claim 6, wherein an anodizing current density is set to be 1 mA/cm$^2$ or less.

8. A method for fabricating a switching device according to claim 6, wherein during the anodization of the pattern, an anodizing current is gradually increased for a time period until an anodizing voltage reaches a chosen value, and after the time period has elapsed, anodization of the pattern is performed while maintaining the chosen anodization voltage, so that the change of the anodizing current in the time period along a time axis is symmetric with respect to the change of the anodizing current along the time axis after the chosen anodizing voltage is reached.

* * * * *